United States Patent

Hause et al.

Patent Number: 5,933,717
Date of Patent: Aug. 3, 1999

[54] VERTICAL TRANSISTOR INTERCONNECT STRUCTURE AND FABRICATION METHOD THEREOF

[75] Inventors: Frederick N. Hause, Austin; Mark I. Gardner, Cedar Creek, both of Tex.

[73] Assignee: Advanced Micro Devices, Inc., Sunnyvale, Calif.

[21] Appl. No.: 08/811,381

[22] Filed: Mar. 4, 1997

[51] Int. Cl.⁶ .............................................. H01L 21/8238
[52] U.S. Cl. ........................ 438/200; 438/275; 438/589
[58] Field of Search ................................... 438/200, 275, 438/589, 259

[56] References Cited

U.S. PATENT DOCUMENTS

| | | | |
|---|---|---|---|
| 4,589,193 | 5/1986 | Goth et al. | 29/576 W |
| 4,717,682 | 1/1988 | Taka et al. | 437/31 |
| 4,916,083 | 4/1990 | Monkowski et al. | 437/31 |
| 5,032,882 | 7/1991 | Okumura et al. | 357/23.6 |
| 5,077,228 | 12/1991 | Eklund et al. | 437/40 |
| 5,164,325 | 11/1992 | Cogan et al. | 437/29 |
| 5,242,845 | 9/1993 | Baba et al. | 437/40 |
| 5,250,450 | 10/1993 | Lee et al. | 437/40 |
| 5,358,884 | 10/1994 | Voilette | 437/341 |
| 5,429,977 | 7/1995 | Lu et al. | 437/52 |
| 5,464,780 | 11/1995 | Yamazaki | 437/41 |
| 5,705,409 | 1/1998 | Witek | 437/35 |
| 5,719,067 | 2/1998 | Gardner et al. | 437/40 |
| 5,721,148 | 2/1998 | Nishimura | 437/40 |
| 5,726,088 | 3/1998 | Yanagiya et al. | 438/270 |
| 5,770,514 | 6/1998 | Matsuda et al. | 438/589 |
| 5,773,343 | 6/1998 | Lee et al. | 438/259 |

Primary Examiner—John F. Niebling
Assistant Examiner—Michael Lebentritt
Attorney, Agent, or Firm—Skjerven, Morrill, MacPherson, Franklin & Friel LLP; Ken J. Koestner

[57] ABSTRACT

It has been discovered that improvements in the compactness and performance of integrated circuit devices are gained through the fabrication of vertical transistors for which channel sizes are determined by the accuracy of etch techniques rather than the resolution of photolithographic techniques. Etching in the vertical dimension is precisely controlled to resolutions of about 0.1 μm while advanced photolithographic techniques in a volume production environment achieve resolutions of 0.25 μm. Interconnect structures for connecting to high density vertical transistors are formed by depositing metal into the trenches etched during fabrication of the vertical transistors. A method of fabricating an integrated circuit includes etching a trench with a sidewall in a substrate wafer and forming a vertical transistor on the sidewall. The vertical transistor has a drain, a channel and a source doped at a series of vertical depths in the substrate wafer. The transistor has a gate coupled to the sidewall adjacent to the drain, the channel, and the source. The method of fabricating an integrated circuit further includes forming an interconnect in the trench coupled to the vertical transistor. An integrated circuit includes a substrate wafer having a trench with a sidewall and a vertical transistor formed on the sidewall of the trench. The vertical transistor has a drain, a channel and a source doped at a series of vertical depths in the substrate wafer. The vertical transistor has a gate coupled to the sidewall adjacent to the drain, the channel, and the source. The integrated circuit further includes an interconnect in the trench coupled to the vertical transistor.

37 Claims, 7 Drawing Sheets

VERTICAL TRANSISTOR INTERCONNECT STRUCTURE AND FABRICATION METHOD THEREOF

BACKGROUND OF THE INVENTION

1. Field of the Invention

The present invention relates to an integrated circuit and fabrication method. More specifically, the present invention relates to an integrated circuit including an interconnect structure connecting multiple vertical transistors with spacer gates.

2. Description of the Related Art

A key concept in the evolution of MOSFET integrated circuits is the usage of scaling to continually reduce the size of devices and thereby increase the density and speed of digital integrated circuits. The density of integrated circuits is improved by using smaller channel lengths and channel widths. The speed of digital integrated circuits is improved by increasing the saturation drain current $I_{dsat}$ of MOSFET devices, thereby promoting faster charging and discharging of parasitic capacitances. Fortunately, an increase in the saturation drain current $I_{dsat}$ of MOSFET devices automatically results from a decrease in channel length or a reduction in gate oxide thickness. In fact, models of MOSFET functionality imply that the saturation drain current $I_{dsat}$ will continue to increase indefinitely as the channel length and gate oxide thickness are reduced so that only limitations of process technology rather than device effects prevent the design and manufacture of ever smaller and increased performance MOSFETs.

The fabrication of increasingly smaller features in integrated circuits depends on the availability of increasingly higher resolution photolithography equipment. Increases in resolution have been gained by decreasing the illuminating wavelength of the optical equipment or increasing the numerical aperture of the system lens. Other techniques for increasing the resolution of photolithography equipment include increasing the contrast of the photoresist mask applied to the imaged semiconductor wafer. The contrast of the photoresist mask is increased by modifying the resist chemistry, creating entirely new photoresists, or using contrast enhancement layers to allow a smaller modulation transfer function to produce adequate images. Further enhancements are gained by adjusting the coherence of the optical system.

The need for high resolution lithography extends not only to the formation of integrated circuit devices but also to interconnect structures for electrically connecting the various devices. The formation of highly compact transistors and devices creates a problem of making connections with these transistors and devices. Typically interconnect structures are made through layers of oxide, forming an unsuitable, nonplanar structure. Interconnections to transistors and devices generally have a minimum feature size including structures for forming connections between portions of the integrated circuit. The minimum feature size limits the density of integrated circuit packing and circuit performance.

All of these techniques have been employed with varying degrees of success. However, further improvements in integrated circuit density and performance are continually sought.

What is needed is a technique for accurately and consistently creating smaller and increased performance MOSFETs and creating precise interconnect structures for connecting the smaller and increased performance MOSFETs. What is further needed is a technique for making compact interconnections to compact transistors and devices.

SUMMARY OF THE DESCRIPTION

It has been discovered that improvements in the compactness and performance of integrated circuit devices are gained through the fabrication of vertical transistors for which channel sizes are determined by the accuracy of etch techniques rather than the resolution of photolithographic techniques. Etching in the vertical dimension is precisely controlled to resolutions of about 0.025 $\mu$m while advanced photolithographic techniques in a volume production environment achieve resolutions of 0.25 $\mu$m. Interconnect structures for connecting to high density vertical transistors are formed by depositing metal into the trenches etched during fabrication of the vertical transistors.

In accordance with an embodiment of the present invention, a method of fabricating an integrated circuit includes etching a trench with a sidewall in a substrate wafer and forming a vertical transistor on the sidewall. The vertical transistor has a drain, a channel and a source doped at a series of vertical depths in the substrate wafer. The transistor has a gate coupled to the sidewall adjacent to the drain, the channel, and the source. The method of fabricating an integrated circuit further includes forming an interconnect in the trench coupled to the vertical transistor.

In accordance with an additional embodiment of the present invention, a method of fabricating an integrated circuit includes forming a plurality of doped layers including a source layer, a drain layer and a channel layer in a series of depths in a substrate wafer, and etching a trench in the substrate wafer. The trench extends through the doped layers at a plurality of depths and is bounded by vertical sidewalls and a planar horizontal floor. The method further includes forming a gate oxide layer on the substrate wafer, the vertical sidewalls, and the planar horizontal floor, forming a gate on a vertical sidewall of the trench, and depositing a metal interconnect in the trench and connected to the gate.

In accordance with a further embodiment of the present invention, an integrated circuit includes a substrate wafer having a trench with a sidewall and a vertical transistor formed on the sidewall of the trench. The vertical transistor has a drain, a channel and a source doped at a series of vertical depths in the substrate wafer. The vertical transistor has a gate coupled to the sidewall adjacent to the drain, the channel, and the source. The integrated circuit further includes an interconnect in the trench coupled to the vertical transistor.

Many advantages are gained by the described integrated circuit and fabrication method. The illustrative method advantageously forms interconnections with the gates of highly compact transistors without forming vias through layers of oxide, resulting in a highly planar and compact interconnect structure. The illustrative method advantageously forms an interconnection between transistors and the metal interconnect structure at an early stage of processing, resulting in a compact, highly planarized structure. The method also advantageously forms interconnections with a plurality of transistors in a single metal deposition. It is advantageous that the described integrated circuit avoids minimum feature size restrictions on integrated circuit density.

The method advantageously forms a highly compact structure in which multiple transistors are formed in a very small area. The compact structure improves integrated circuit density and improves digital circuit performance. The fabrication method accurately, consistently, and highly controllably forms integrated circuit transistors and devices having channel widths that are substantially smaller than channel widths that are created using conventional photolithographic techniques.

It is further advantageous that the described fabrication method uses a gate polysilicon mask that selectively patterns the polysilicon gates to individually set the gate width of particular transistors. It is advantageous that the individual gate widths are formed using a single masking procedure.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIGS. 3A(i) and 3A(ii) through 3I(i) and 3I(ii) are sequences of respective schematic cross-section views and schematic top views of a silicon wafer undergoing processing of a series of integrated circuit processing steps.

FIGS. 4(i) and 4(ii) are respectively a schematic cross-section view and a schematic top view of a silicon wafer using an alternative embodiment of an interconnect structure including a gate connection and a source connection.

DETAILED DESCRIPTION OF THE ILLUSTRATIVE EMBODIMENTS

Figure 1:
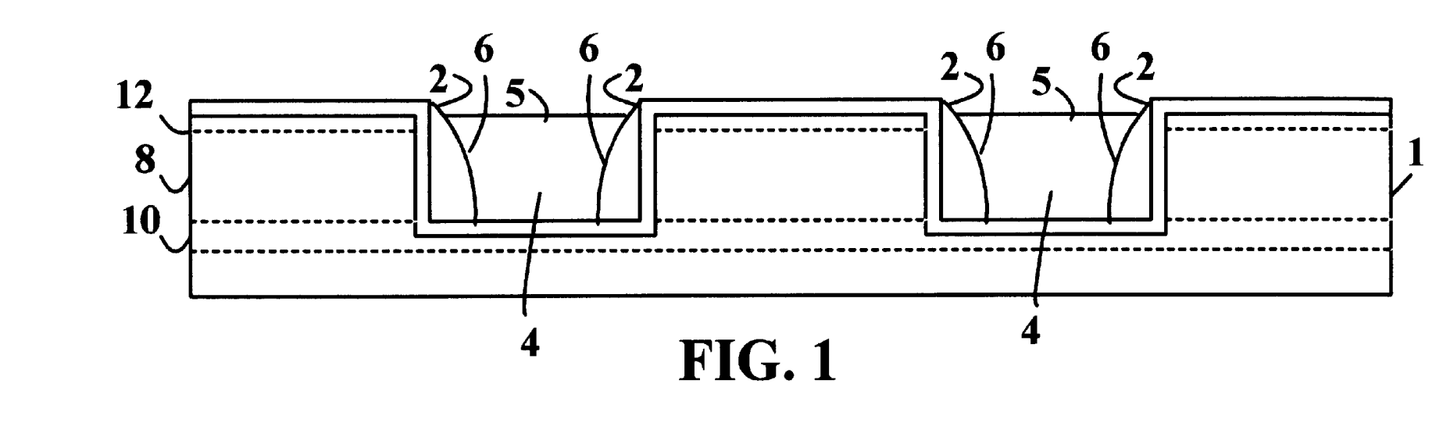
FIG. 1 shows a schematic cross-sectional view of a first embodiment of an integrated circuit including multiple vertical transistors and an interconnect structure.

Referring to FIG. 1, a schematic cross-sectional view shows a first embodiment of an integrated circuit including multiple vertical transistors and an interconnect structure. A silicon wafer 1 includes a plurality of transistors 2 formed in a trench 4 etched into the wafer 1. While the illustration shows a silicon wafer 1 with four transistors 2, any number of transistors may be included in a particular embodiment. While the trench 4 is illustrated as a rectangular trench, other shapes and forms of trenches may be formed in various embodiments. The transistors 2 are electrically and logically connected by an interconnect structure 5 formed in the trench 4. The transistors 2 include a polysilicon gate 6 which is formed from a sidewall spacer on the edges of the trench 4. The transistors 2 also include a channel region 8 extending vertically within the silicon wafer 1 on the sides of the trench 4, and a source region 10 and a drain region 12 bounding the channel region 8. The source region 10 and the drain region 12 overlie and underlie the channel region 8. The width of the channel region 8 determines the size of the transistors 2 and is selected within very compact ranges such as a range from 0.1 μm to 0.3 μm, advantageously forming a highly compact structure in which multiple transistors are formed in a very small area. A gate polysilicon mask (not shown) is selectively patterned to control the widths of the various polysilicon gates 6 so that the gate widths may be individually selected using a single masking process.

Figure 2:
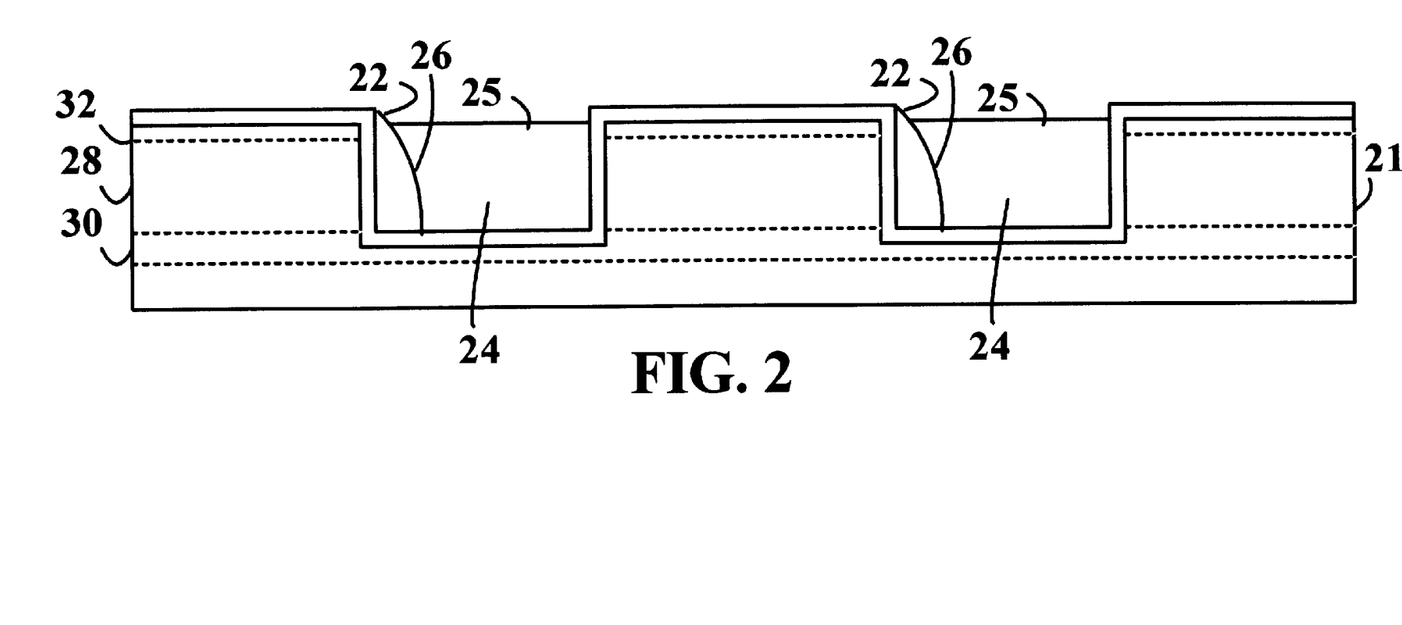
FIG. 2 shows a schematic cross-sectional view of a second embodiment of an integrated circuit including multiple vertical transistors and an interconnect structure.

Referring to FIG. 2, a schematic cross-sectional view shows a second embodiment of an integrated circuit including multiple vertical transistors and an interconnect structure. A silicon wafer 21 includes a plurality of transistors 22 formed in a trench 24 etched into the wafer 21. A masking process is used to form transistors 22 on only one side of the trench 24. The transistors 22 are electrically and logically connected by an interconnect structure 25 formed in the trench 24. The transistors 22 include a polysilicon gate 26 which is formed from a sidewall spacer on the edges of the trench 4. The transistors 22 also include a channel region 28 extending vertically within the silicon wafer 21 on the sides of the trench 24, and a source region 30 and a drain region 32 bounding the channel region 28. The source region 30 and the drain region 32 overlie and underlie the channel region 28. The width of the channel region 28 determines the size of the transistors 22 and is selected within very compact ranges such as a range from 0.1 μm to 0.3 μm, advantageously forming a highly compact structure in which multiple transistors are formed in a very small area. A gate polysilicon mask (not shown) is selectively patterned to control the widths of the various polysilicon gates 26 so that the gate widths may be individually selected using a single masking process.

Figure 3A:
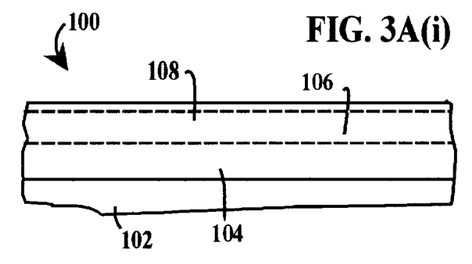
Figure 3B:
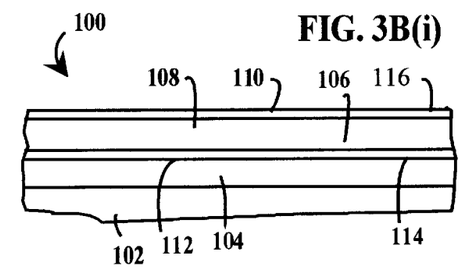
Figure 3C:
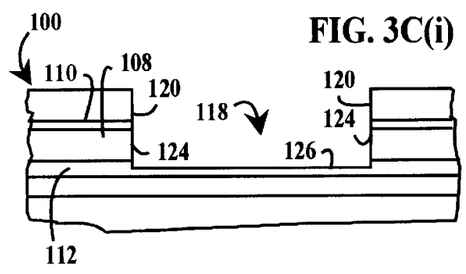
Figure 3D:
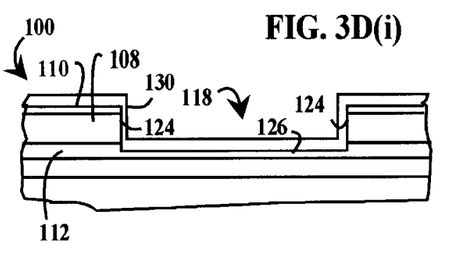
Figure 3E:
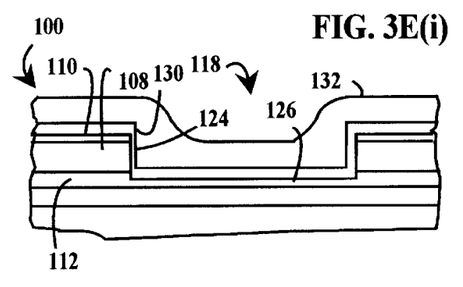
Figure 3F:
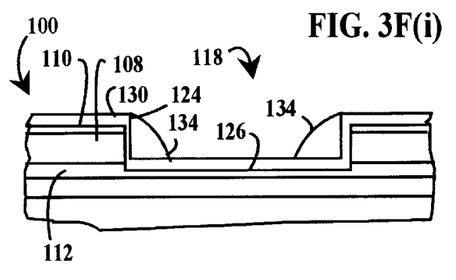
Figure 3G:
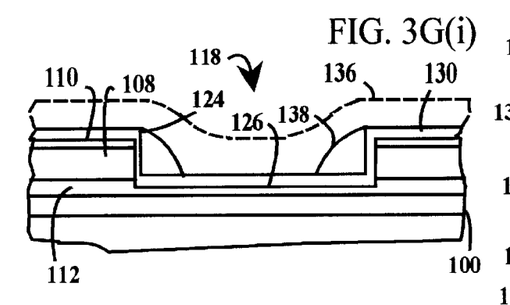
Figure 3H:
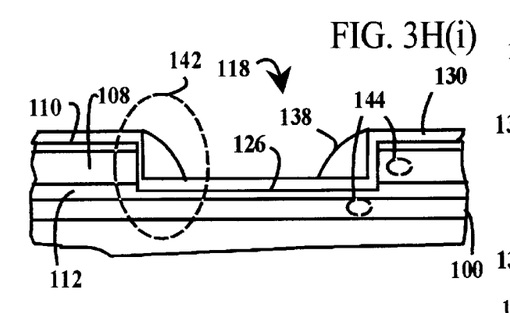
Figure 3I:
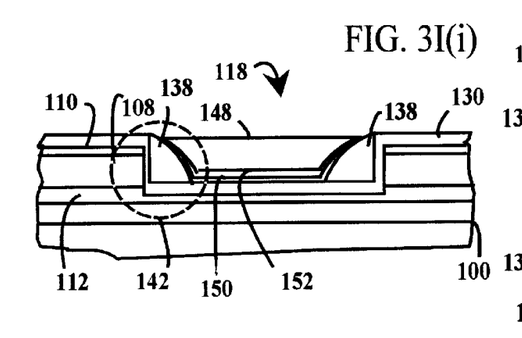

FIGS. 3A(i) and 3A(ii) through 3I(i) and 3I(ii) are sequences of respective schematic cross-section views and schematic top views of a silicon wafer 100 undergoing processing of a series of integrated circuit processing steps.

Referring to FIGS. 3A(i) and 3A(ii), various suitable processing steps are performed to form a plurality of transistor structures. In one exemplary embodiment, NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16}/cm^3$. The starting material is typically a heavily-doped <100>-orientation silicon substrate 102 having a quality suitable for integrated circuit manufacture, upon which a thin (5 μm to 10 μm) lightly-doped epitaxial layer 104 is grown. The illustrative epitaxial layer 104 is a P-type epitaxial surface layer with a <100> orientation and a resistivity of 12 ohm-cm. Either an n-epi-on-n$^+$ or a p-epi-on-p$^+$ substrate may be used for the epitaxial layer 104. The a p-epi-on-p$^+$ substrate is more typically used due to a lesser sensitivity to process-induced defects. The silicon substrate 102 and the epitaxial layer 104 in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/cm$^2$ and an energy in the range from about 50 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/cm$^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

In the illustrative embodiment, a doped P-layer 106 is formed in the silicon wafer 100 so that a plurality of p-channel transistors are fabricated in the same wafer in CMOS technologies. In other embodiments, a doped N-layer may be formed to fabricate a plurality of N-channel transistors. In further embodiments, a P-layer is formed in some portions of the silicon wafer and an N-layer is formed in other portions of the silicon wafer so that both N-channel and P-channel transistors are formed in a single wafer.

N-layers and P-layers are regions of opposite doping that are the first features defined on a silicon wafer. N-layers and P-layers are formed by implanting and diffusing appropriate dopants, for example phosphorus or arsenic for N-layers and boron for P-layers to attain a suitable well depth and doping profile. The dual layers may be formed using various techniques. In one example, the two layers are formed using two masking steps, each of which blocks one of the implants.

In the illustrative embodiment, the P-layer 106 is formed by doping the silicon wafer 100 with a boron or $BF_2$ implant at a suitable energy and implant intensity. The P-layer 106 doping forms a P-channel region 108 that serves as the channel for the plurality of P-channel transistors.

The P-layer 106, or in an alternative embodiment the N-layer, is rapid thermal annealed (RTA) for example at a temperature of 1000° C. to 1100° C. for 30 seconds. Following the anneal step, the concentration in the layer is suitable for subsequent processing. In one example, a 0.8 $\mu$m CMOS process, a suitable P-layer 106 concentration is about $10^{16}$/cm$^3$ while a suitable N-layer concentration is about $3\times10^{16}$/cm$^3$.

Typically, a channel-stop procedure is included in the process sequence for forming the wells. Various procedures are used to form channel-stop implants. In one embodiment, a single P-layer channel-stop implant of boron is used since doping in the N-layer is generally sufficient that a second channel-stop is not necessary. Alternatively, separate channel-stop implants may be implemented for the P-layers and the N-layers. In this process, boron is implanted into both the P-layers and the N-layers so that a phosphorus channel-stop implant is increased to compensate for the boron implant of the N-layer regions. Also alternatively, a maskless channel-stop procedure is used in which both boron and phosphorus are implanted into the N-layer regions, placing both dopants that form the layer and the dopants forming the channel-stop into the N-layer regions prior to implanting of the P-layers. An oxide is then grown on the N-layer regions and the boron implant for the P-layer is implanted. The N-layers are annealed, the oxide layer overlying the N-layers is retained, and a second boron implant is performed, serving both as a channel-stop implant in the P-layer field regions and a punchthrough prevention implant in the active regions of the P-layer 106.

Following implantation for channel doping, threshold voltage $V_T$ adjustment, and punchthrough control, drain and source implants are performed as is shown with reference to FIGS. 3B(*i*) and 3B(*ii*). In the illustrative embodiment of a silicon wafer 100 including a channel formed of a doped P-layer 106, N-type dopant atoms are implanted for form a drain layer 110 and a source layer 112. An N-type species is implanted to a suitable depth into the silicon wafer 100 by controlling the implant energy and by selection of the species. A suitable channel width is selected and the drain layer 110 and source layer 112 are implanted at a depth in the silicon wafer 100 that attains the selected channel width. For example, the P-layer 106 is bounded by a first N-type implant 114 at a depth in a range from approximately 0.025 $\mu$m to 0.3 $\mu$m and a second N-type implant 116 at the surface of the silicon wafer 100 to achieve a P-channel width of about 0.025 $\mu$m to 0.3 $\mu$m. The first N-type implant 114 is typically a phosphorus or arsenic implant. In one example, phosphorus is implanted at a depth of approximately 0.3 $\mu$m by injecting phosphorus ions at a dosage in a range from $1\times10^{15}$ to $5\times10^{15}$ atoms/cm$^2$ and an energy in the range of 100 keV to 300 keV. The second N-type implant 116, for a shallow source arsenic is implanted at a dosage in a range from $1\times10^{15}$ to $5\times10^{15}$ atoms/cm$^2$ and an energy in the range of 2 keV to 30 keV. In one example, arsenic is implanted at a depth of approximately at the surface of the silicon wafer 100 by injecting arsenic ions at a dosage in a range from $1\times10^{18}$ to $1\times10^{19}$ atoms/cm$^2$ and an energy in the range of 2 to 30 kiloelectron-volts (keV).

Referring to FIGS. 3C(*i*) and 3C(*ii*), a trench 118 is formed in the silicon wafer 100 to a selected depth, typically in a range from 0.025 $\mu$m to 0.25 $\mu$m. Although the trench 118 is illustratively formed following the source/drain implant, in other embodiments, the source/drain implants may be performed after the trench 118 is etched. The trench 118 is formed using any suitable etch technique including anisotropic and isotropic etch procedures, and wet and dry etch techniques. Generally substantially vertical walls of the trench 118 are desired so that anisotropic etching is highly suitable in comparison to isotropic etching. Furthermore, dry etch techniques are highly suitable in comparison to wet etch techniques to achieve a uniform and controlled trench depth.

In the illustrative embodiment, the trench 118 is formed using an anisotropic dry etch that is suitable for etching silicon. Suitable etch techniques include plasma etch processes, reactive ion etching (RIE) processes, and the like. The trench 118 is formed by patterning a photoresist mask 120 over the surface of the silicon wafer 100 and is shown in a rectangular shape in the top view of FIG. 3C(*ii*). In other embodiments, the trench 118 may have a shape other than rectangular. The photoresist mask 120 protects surface regions 122 of the silicon wafer 100 surrounding the trench 118 but leaves a region of the trench 118 exposed. The etch procedure forms substantially vertical sidewalls 124 and a substantially planar floor 126 of the trench 118. The floor 126 of the trench 118 is etched to the depth of the first N-type implant 114.

In the illustrative embodiment, various doping processes including formation of the P-layer 106, threshold voltage $V_T$ adjustment, punchthrough control implants, channel doping, and source/drain implants are performed prior to etching of the trench 118. In alternative embodiments, some or all of the doping processes may be performed subsequent to etching of the trench 118.

Referring to FIGS. 3D(i) and 3D(ii), the photoresist mask 120 is stripped and a gate oxide layer 130 is grown overlying the silicon wafer 100, uniformly covering the surface regions 122 of the silicon wafer 100 outside the trench 118, the trench vertical sidewalls 124, and the floor 126 of the trench 118. The gate oxide layer 130 is free of defects and has a thickness in a range from 30 Å to 150 Å. The gate oxide layer 130 is formed from a high-quality oxide and is substantially free of contamination. The gate oxide layer 130 is generally composed of silicon dioxide and is formed on the top surface of the silicon wafer 100 using tube growth at a temperature of 700 to 1000° C. in an $O_2$ ambient. The gate oxide layer 130 is grown only in exposed active regions of the silicon wafer 100. The gate oxide layer 130 is formed as thin as possible to increase drain current, but formed sufficiently thick to avoid oxide breakdown and attain reliable operation.

Referring to FIGS. 3E(i) and 3E(ii), a blanket layer of undoped polysilicon 132 is deposited by low pressure chemical vapor deposition (LPCVD) on the top surface of gate oxide layer 130. The undoped polysilicon 132 has a thickness of approximately 2000 Å. In some embodiments, the undoped polysilicon 132 is doped in situ during deposition. In other embodiments, the undoped polysilicon 132 is doped before etching by implanting arsenic with a dosage in the range of $1\times10^{15}$ to $5\times10^{15}$ atoms/cm$^2$ and an energy in the range of 2 to 50 kiloelectron-volts (keV). In various embodiments, the undoped polysilicon 132 is doped, typically using an $N^+$ implant, either before etching or after etching. In some embodiments, the polysilicon is doped from a diffusion source. In the illustrative embodiment, the undoped polysilicon 132 is doped during a later process step when a dopant is introduced into the silicon wafer 100. The undoped polysilicon 132 is etched using an anisotropic dry etch process that is selective to polysilicon over $SiO_2$ etching to avoid etching of the underlying gate oxide layer 130. Anisotropic etching of polysilicon typically utilizes etch gases containing both chlorine and fluorine to avoid undercutting while maintaining high etch rates and good selectivity over $SiO_2$ etching.

Referring to FIGS. 3F(i) and 3F(ii), the anisotropic dry-etch process clears the undoped polysilicon 132 in the planar areas of the surface regions 122 and the floor 126 of the silicon wafer 100 while leaving polysilicon spacers 134 on the vertical sidewalls 124 of the trench 118. The polysilicon spacers 134 are etched to an endpoint with minimal over-etch so that the height of the polysilicon spacers 134 is substantially the same height as the vertical sidewalls 124 of the trench 118. For a height of 0.3 µm and a deposited polysilicon film thickness of about 0.3 µm, the width of the polysilicon spacers 134 is approximately 0.2 µm.

Referring to FIGS. 3G(i) and 3G(ii), a gate polysilicon mask 136 is formed over the silicon wafer 100 and patterned using conventional photolithographic techniques. The gate polysilicon mask 136 is a photoresist mask and is used to define the structure of a plurality of polysilicon gates 138. The polysilicon gates 138 are patterned using a reactive ion etch (RIE) process that produces individual polysilicon gates 138 with substantially vertical sidewalls 140 on etched sides of the polysilicon spacers 134. The polysilicon spacers 134 are etched using an anisotropic dry etch process that is selective to polysilicon over $SiO_2$ etching to avoid etching of the underlying gate oxide layer 130. The gate polysilicon mask 136 is stripped.

Advantageously, the gate polysilicon mask 136 is selectively patterned to form different widths of the polysilicon gates 138 in a single masking procedure. The gate polysilicon mask 136 forms a pattern of transistors on multiple sides of the trench 118 to form the structure shown in FIG. 1. The gate polysilicon mask 136 forms a pattern of transistors on only one side of the trench 118 to form the structure shown in FIG. 2.

Referring to FIGS. 3H(i) and 3H(ii), individual N-channel transistors 142 are formed including the individual polysilicon gates 138 in combination with the drains 110 and sources 112 previously implanted into the silicon wafer 100. The N-channel transistors 142 have a vertical topology and a highly compact channel region. In some embodiments, lightly-doped drain (LDD) structures 144 are formed by injecting a $N^-$ implant of arsenic ions into the top surface 146 of the silicon wafer 100 and into the floor 126 of the trench 118. The LDD structures 144 are self-aligned with the polysilicon gates 138 of the vertical N-channel transistors 142. The $N^-$ implant is performed using a medium-current implanter with an ion beam that is tilted at a 7° angle to reduce implant channeling effects.

The N-channel transistors 142 formed using the illustrative fabrication technique advantageously have a very narrow channel width in the range from 0.1 µm to 0.3 µm, advantageously forming a highly compact structure in which multiple transistors are formed in a very small area.

Referring to FIGS. 3I(i) and 3I(ii), the individual N-channel transistors 142 are interconnected by the deposition of a metal interconnect structure 148. The metal interconnect structure 148 is formed by first depositing a titanium sacrificial barrier 150 into the trench 118 in contact with the polysilicon gates 138. Titanium films are used as a diffusion barrier since titanium (Ti) is an oxygen-gettering material and oxide-reducing agent. Accordingly, titanium dissolves a native oxide layer on the silicon surface of the polysilicon gates 138 during annealing and adheres well to both silicon and oxide ($SiO_2$). In addition, titanium forms good ohmic contacts to heavily-doped silicon whether the doping is N-type doping or P-type doping.

The illustrative structure advantageously facilitates circuit arrangements in which the gates of two or more transistors are connected.

In the illustrative embodiment, the metal interconnect structure 148 is an aluminum interconnect. The titanium sacrificial barrier 150 between the polysilicon of the polysilicon gates 138 and the aluminum metal interconnect structure 148 functions as a sacrificial barrier through the reaction of titanium with aluminum to form $TiAl_3$ at temperatures above 400° C. Titanium forms a suitable diffusion barrier for silicon at temperatures below 500° C. but does not form as good a barrier for aluminum. The titanium sacrificial barrier 150 is formed by depositing a very thin layer of titanium onto the silicon wafer 100 including deposition into the trench 118. The silicon wafer 100 is annealed to react the titanium with the silicon in the undoped polysilicon, thereby forming $TiSi_2$. The titanium is deposited as a very thin layer to avoid absorption of dopants from the undoped polysilicon 132 during formation of $TiSi_2$.

Following the formation of the titanium sacrificial barrier 150, a titanium nitride (TiN) passive barrier 152 is formed over the titanium sacrificial barrier 150. The TiN passive barrier 152 serves as a contact diffusion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier 152 is formed using one of multiple techniques. For example, the TiN passive barrier 152 is formed by: (1) evaporating titanium in a nitrogen ($N_2$) ambient, (2) reactively sputtering the titanium in an argon (Ar)-nitrogen ($N_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The aluminum metal interconnect structure 148 is formed by depositing aluminum onto the surface of the silicon wafer 100. The metal interconnect structure 148 is patterned to leave aluminum applied to the trench 118 over the titanium sacrificial barrier 150 and the TiN passive barrier 152. The metal interconnect structure 148 is then sintered, causing the aluminum to react with a native-oxide layer that forms on the silicon wafer 100 surface. The aluminum reacts with a thin $SiO_2$ layer, forming $Al_2O_3$. In a good ohmic contact, the native-oxide is consumed. Once the native oxide is consumed, the aluminum diffuses through the $Al_2O_3$ layer to form an intimate metal-Si contact.

Once the metal interconnect structure 148 is formed, chemical-mechanical polishing (CMP) is used to planarize the surface of the silicon wafer 100. CMP creates a smooth, planar surface for intermediate processing steps of an integrated circuit fabrication process and removes undesirable residues that remain from other substrate processing steps. CMP involves simultaneous chemically etching and mechanical polishing or grinding of a surface so that a combined chemical reaction and mechanical polishing removes a desired material from the substrate surface in a controlled manner. The resulting structure is a planarized substrate surface with any protruding surface topography leveled. CMP is typically performed by polishing a substrate surface against a polishing pad that is wetted with a slurry including an acidic or basic solution, an abrasive agent and a suspension fluid.

The illustrative method advantageously forms interconnections with the gates of highly compact transistors without forming vias through layers of oxide, resulting in a highly planar and compact interconnect structure. The illustrative method advantageously forms an interconnection between transistors and the metal interconnect structure 148 at an early stage of processing, resulting in a compact, highly planarized structure. The method also advantageously forms interconnections with a plurality of transistors in a single metal deposition.

Figure 4:
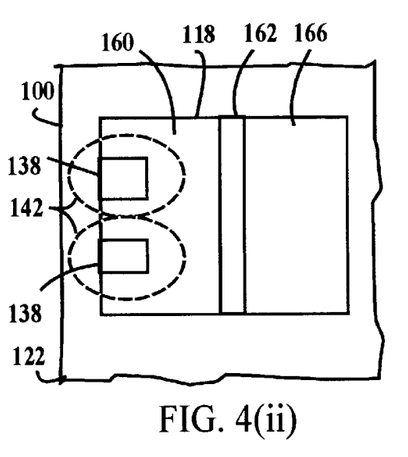
Figure 4I:
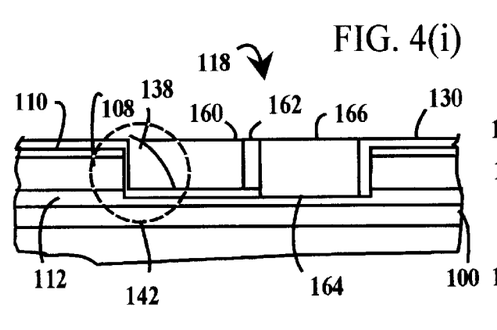

Referring to FIGS. 4(i) and 4(ii), a schematic cross-section view and a schematic top view of a silicon wafer show an alternative embodiment of an interconnect structure including a gate connection and a source connection. The interconnection structure is formed using the techniques described with respect to FIGS. 3A(i) and 3A(ii) through 3I(i) and 3I(ii). Upon completion of the metal interconnect structure 148 including the chemical-mechanical polishing process, the metal interconnect structure 148 is cut into two portions, a first metal interconnect portion 160 which is left to form a connection to the N-channel transistors 142 and a second portion that is removed. An oxide spacer 162 is deposited and etched forming a spacer in the trench 118 to form an insulating barrier.

Figure 5:
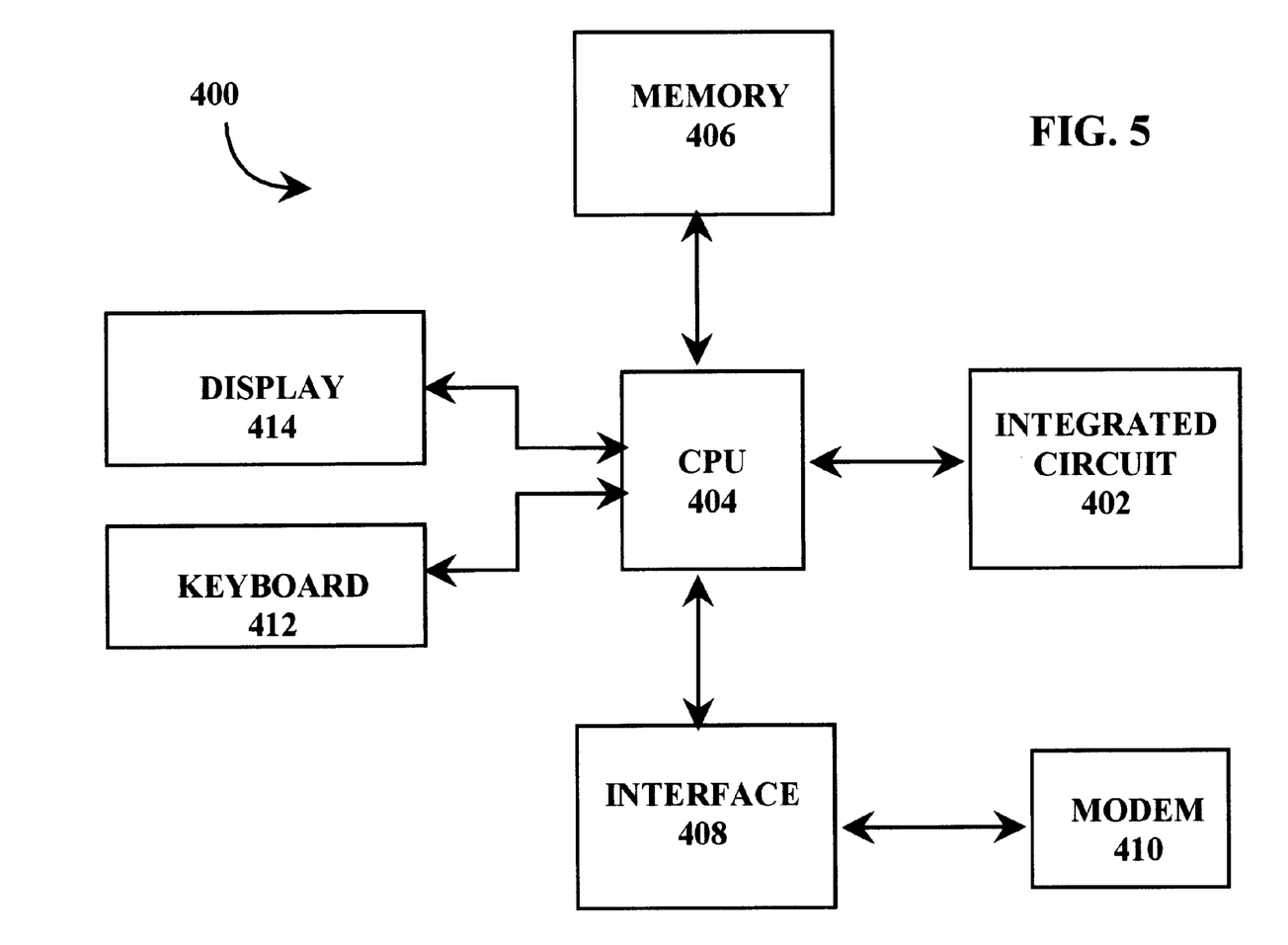
FIG. 5 is a schematic block diagram illustrating a computer system including an integrated circuit including vertical transistors with spacer gates fabricated using a method as depicted in FIGS. 3A(i) and 3A(ii) through 3I(i) and 3I(ii).

Referring to FIG. 5, a computer system 400 includes an integrated circuit 402, a central processing unit 404, a memory 406, and an interface 408, connected to a modem 410. The computer system 400 also includes a keyboard 412 and a display 414 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of fabricating an integrated circuit comprising:

etching a trench with a sidewall and a floor in a substrate wafer;

forming a vertical transistor on the sidewall, the transistor having a drain, a channel and a source doped at a series of vertical depths in the substrate wafer, the transistor having a gate coupled to the sidewall adjacent to the drain, the channel, and the source; and forming an interconnect in the trench coupled to the vertical transistor including:
        forming a sacrificial barrier in the trench; and
        depositing a metal interconnect in the trench over the sacrificial barrier.

2. A method according to claim 1, wherein:

the vertical transistor is formed with a channel length in a range from approximately 0.025 µm to 0.25 µm.

3. A method according to claim 1, wherein forming a sacrificial barrier further comprises:

depositing a thin layer of titanium in the trench; and
    reacting the titanium and silicon by annealing.

4. A method according to claim 1, wherein forming an interconnect further comprises:

forming a passive barrier in the trench; and
    depositing a metal interconnect in the trench over the passive barrier.

5. A method according to claim 1, wherein forming an interconnect further comprises:

forming a sacrificial barrier in the trench;
    forming a passive barrier over the sacrificial barrier; and
    depositing a metal interconnect in the trench over the passive barrier.

6. A method according to claim 5, wherein forming an interconnect further comprises:

chemical-mechanical polishing (CMP) the metal interconnect.

7. A method according to claim 1, further comprising:
    forming a plurality of vertical transistors on the sidewall; and
    coupling ones of the plurality of vertical transistors using the interconnect.
8. A method according to claim 1, wherein forming a vertical transistor further comprises:
    implanting a channel of a first conductivity type;
    implanting a source of a second conductivity type opposite in conductivity to the first conductivity type; and
    implanting a drain of the second conductivity type opposite in conductivity to the first conductivity type, the drain being separated from the source by the channel.
9. A method according to claim 8, wherein:
    the first conductivity type is a P-type;
    the second conductivity type is an N-type; and
    the source, drain and gates form an N-channel transistor.
10. A method according to claim 1, further comprising:
    forming a first partial interconnect in the trench coupled to the vertical transistor;
    exposing the source at the floor of the trench in the portion of the trench uncovered by the first partial interconnect;
    forming an insulating structure between the first partial interconnect and the exposed floor of the trench; and
    forming a second partial interconnect coupled to the exposed source in the portion of the trench uncovered by the first partial interconnect.
11. An integrated circuit chip including an integrated circuit formed using the method of claim 1.
12. An electronic system including a microprocessor, a memory, a system bus and an integrated circuit fabricated using the method of claim 1.
13. A method of fabricating an integrated circuit comprising:
    forming a plurality of doped layers including a source layer, a drain layer and a channel layer in a series of depths in a substrate wafer;
    etching a trench in the substrate wafer, the trench extending through the doped layers at a plurality of depths and being bounded by vertical sidewalls and a planar horizontal floor, wherein:
        the trench is etched to a depth length in a range from approximately 0.025 $\mu$m to 0.25 $\mu$m and the length of the channel is formed in a range from approximately 0.025 $\mu$m to 0.25 $\mu$m;
    forming a gate oxide layer on the substrate wafer, the vertical sidewalls, and the planar horizontal floor;
    forming a gate on a vertical sidewall of the trench; and
    depositing a metal interconnect in the trench and coupled to the gate.
14. A method of fabricating an integrated circuit comprising:
    forming a plurality of doped layers including a source layer, a drain layer and a channel layer in a series of depths in a substrate wafer;
    etching a trench in the substrate wafer, the trench extending through the doped layers at a plurality of depths and being bounded by vertical sidewalls and a planar horizontal floor;
    forming a gate oxide layer on the substrate wafer, the vertical sidewalls, and the planar horizontal floor;
    forming a gate on a vertical sidewall of the trench; and
    depositing a metal interconnect in the trench and coupled to the gate further comprising:
        forming a sacrificial barrier in the trench; and
        depositing a metal interconnect in the trench over the sacrificial barrier.
15. A method according to claim 13, wherein forming a sacrificial barrier further comprises:
    depositing a thin layer of titanium in the trench; and
    reacting the titanium and silicon by annealing.
16. A method according to claim 13, wherein depositing the metal interconnect further comprises:
    forming a passive barrier in the trench; and
    depositing a metal interconnect in the trench over the passive barrier.
17. A method according to claim 13, wherein depositing the metal interconnect further comprises:
    forming a sacrificial barrier in the trench;
    forming a passive barrier over the sacrificial barrier; and
    depositing a metal interconnect in the trench over the passive barrier.
18. A method according to claim 13, further comprising:
    forming a plurality of gates on the vertical sidewall; and
    coupling ones of the plurality of gates using the interconnect.
19. A method according to claim 13, wherein forming a plurality of doped layers further comprises:
    implanting a channel of a first conductivity type;
    implanting a source of a second conductivity type opposite in conductivity to the first conductivity type; and
    implanting a drain of the second conductivity type opposite in conductivity to the first conductivity type, the drain being separated from the source by the channel.
20. A method according to claim 19 wherein:
    the first conductivity type is a P-type;
    the second conductivity type is an N-type; and
    the source, drain and gates forms an N-channel transistor.
21. A method according to claim 13, further comprising:
    forming a first partial metal interconnect in the trench coupled to the gate;
    exposing the source at the floor of the trench in the portion of the trench uncovered by the first partial metal interconnect;
    forming an insulating structure between the first partial metal interconnect and the exposed floor of the trench; and
    forming a second partial metal interconnect coupled to the exposed source in the portion of the trench uncovered by the first partial metal interconnect.
22. An integrated circuit chip including an integrated circuit formed using the method of claim 13.
23. An electronic system including a microprocessor, a memory, a system bus and an integrated circuit fabricated using the method of claim 13.
24. A method according to claim 13, wherein forming a sacrificial barrier further comprises:
    depositing a thin layer of titanium in the trench; and
    reacting the titanium and silicon by annealing.
25. A method according to claim 13, wherein depositing the metal interconnect further comprises:
    forming a passive barrier in the trench; and
    depositing a metal interconnect in the trench over the passive barrier.
26. A method according to claim 13, wherein depositing the metal interconnect further comprises:
    forming a sacrificial barrier in the trench;

forming a passive barrier over the sacrificial barrier; and depositing a metal interconnect in the trench over the passive barrier.

27. A method according to claim 13, further comprising:

forming a plurality of gates on the vertical sidewall; and coupling ones of the plurality of gates using the interconnect.

28. A method according to claim 13, wherein forming a plurality of doped layers further comprises:

implanting a channel of a first conductivity type;

implanting a source of a second conductivity type opposite in conductivity to the first conductivity type; and implanting a drain of the second conductivity type opposite in conductivity to the first conductivity type, the drain being separated from the source by the channel.

29. A method according to claim 28 wherein:

the first conductivity type is a P-type;

the second conductivity type is an N-type; and the source, drain and gates forms an N-channel transistor.

30. A method according to claim 13, further comprising:

forming a first partial metal interconnect in the trench coupled to the gate;

exposing the source at the floor of the trench in the portion of the trench uncovered by the first partial metal interconnect;

forming an insulating structure between the first partial metal interconnect and the exposed floor of the trench; and forming a second partial metal interconnect coupled to the exposed source in the portion of the trench uncovered by the first partial metal interconnect.

31. An integrated circuit chip including an integrated circuit formed using the method of claim 13.

32. An electronic system including a microprocessor, a memory, a system bus and an integrated circuit fabricated using the method of claim 13.

33. A method of fabricating an integrated circuit on a substrate comprising:

selecting a channel width for an integrated circuit device;

implanting a source layer at a source layer depth of the substrate and implanting a drain layer at a drain layer depth of the substrate, the source layer depth and the drain layer depth being implanted to attain the selected channel width;

forming a trench in the substrate, the trench cutting through the surface of the substrate and extending through the channel width, the trench having substantially vertical sidewalls and a substantially horizontal floor;

forming a polysilicon sidewall spacer on the substantially vertical sidewalls of the trench, the polysilicon sidewall spacer for functioning as a polysilicon gate of an integrated circuit device;

depositing a sacrificial barrier into the trench in contact with the polysilicon gate; and depositing a metal interconnect structure coupled to the polysilicon gate.

34. A method according to claim 33 further comprising:

implanting a channel doping implant into the substrate;

implanting a threshold voltage adjustment implant into the substrate; and implanting a punchthrough control implant into the substrate.

35. A method according to claim 33 wherein implanting the source layer and implanting the drain layer further comprises:

implanting a first N-type implant into a P-type substrate at a depth in a range from approximately 0.025 $\mu$m to 0.3 $\mu$m;

implanting a second N-type implant into the P-type substrate at the surface of the substrate to form a P-channel width of about 0.025 $\mu$m to 0.3 $\mu$m.

36. A method according to claim 33 further comprising:

forming a plurality of polysilicon sidewall spacers on the substantially vertical sidewalls of the trench, the individual polysilicon sidewall spacers being selectively patterned to form different widths of polysilicon gates for a plurality of devices in a single masking procedure.

37. A method according to claim 33 further comprising:

implanting lightly-doped drain (LDD) structures into the surface of the substrate and into the floor of the trench.

* * * * *